(12) United States Patent
Thareja et al.

(10) Patent No.: US 11,114,320 B2
(45) Date of Patent: Sep. 7, 2021

(54) PROCESSING SYSTEM AND METHOD OF FORMING A CONTACT

(71) Applicant: Applied Materials, Inc., Santa Clara, CA (US)

(72) Inventors: Gaurav Thareja, Santa Clara, CA (US); Takashi Kuratomi, San Jose, CA (US); Avgerinos V. Gelatos, Scotts Valley, CA (US); Xianmin Tang, San Jose, CA (US); Sanjay Natarajan, Portland, OR (US); Keyvan Kashefizadeh, Dublin, CA (US); Zhebo Chen, San Jose, CA (US); Jianxin Lei, Fremont, CA (US); Shashank Sharma, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 47 days.

(21) Appl. No.: 16/690,988

(22) Filed: Nov. 21, 2019

(65) Prior Publication Data
US 2020/0203481 A1    Jun. 25, 2020

Related U.S. Application Data

(60) Provisional application No. 62/783,906, filed on Dec. 21, 2018.

(51) Int. Cl.
*H01L 21/67* (2006.01)
*H01L 29/10* (2006.01)
(Continued)

(52) U.S. Cl.
CPC .. *H01L 21/67207* (2013.01); *H01L 21/02271* (2013.01); *H01L 21/28506* (2013.01);
(Continued)

(58) Field of Classification Search
CPC ......... H01L 21/28506; H01L 21/67207; H01L 21/02271
See application file for complete search history.

(56) References Cited

U.S. PATENT DOCUMENTS 5,976,976 A  11/1999  Doan et al.
6,130,145 A  10/2000  Ilg et al.
(Continued)

FOREIGN PATENT DOCUMENTS

TW    201724204 A    7/2017

OTHER PUBLICATIONS

Taiwan Office Action issued to 108146869 dated Sep. 2, 2020.
(Continued)

*Primary Examiner* — Feifei Yeung Lopez
(74) *Attorney, Agent, or Firm* — Patterson + Sheridan, LLP (57) ABSTRACT

Embodiments disclosed herein include a processing system and a method of forming a contact. The processing system includes a plurality of process chambers configured to deposit, etch, and/or anneal a source/drain region of a substrate. The method includes depositing a doped semiconductor layer over a source/drain region, forming an anchor layer in a trench, and depositing a conductor in the trench. The method of forming a contact results in reduced contact resistance by using integrated processes, which allows various operations of the source/drain contact formation to be performed within the same processing system.

19 Claims, 7 Drawing Sheets

(51) Int. Cl.
    *H01L 29/66*          (2006.01)
    *H01L 29/08*          (2006.01)
    *H01L 21/285*        (2006.01)
    *H01L 21/02*          (2006.01)

(52) U.S. Cl.
    CPC ...... *H01L 29/0847* (2013.01); *H01L 29/1087* (2013.01); *H01L 29/66795* (2013.01)

(56) References Cited

U.S. PATENT DOCUMENTS

| | | | |
|---|---|---|---|
| 6,217,721 B1 * | 4/2001 | Xu | ................ H01L 21/76843 |
| | | | 204/192.17 |
| 7,732,269 B2 | 6/2010 | Kim et al. | |
| 7,960,236 B2 | 6/2011 | Chopra et al. | |
| 9,059,024 B2 | 6/2015 | Glass et al. | |
| 9,853,129 B2 | 12/2017 | Bauer et al. | |
| 9,893,189 B2 | 2/2018 | Colinge et al. | |
| 2010/0276761 A1 | 11/2010 | Tung et al. | |
| 2014/0001520 A1 | 1/2014 | Glass et al. | |
| 2014/0008812 A1 | 1/2014 | Emesh | |
| 2015/0041918 A1 | 2/2015 | Wann et al. | |
| 2016/0359008 A1 | 12/2016 | Choi et al. | |
| 2017/0186654 A1 | 6/2017 | Li | |

OTHER PUBLICATIONS

International Search Report and Written Opinion of the International Search Authority for PCT/US2019/062691 dated Mar. 30, 2020.

* cited by examiner

PROCESSING SYSTEM AND METHOD OF FORMING A CONTACT

CROSS-REFERENCE TO RELATED APPLICATIONS

This application claims priority to U.S. Provisional Patent Application No. 62/783,906, filed Dec. 21, 2018, which is hereby incorporated by reference in its entirety.

BACKGROUND

Field

Embodiments of the present disclosure generally relate to an apparatus and a method and, more specifically, to a processing system and a method of forming a contact.

Description of the Related Art

Transistors are fundamental device elements of modern digital processors and memory devices, and have found applications in high-power electronics. Currently, there are a variety of transistor designs or types that may be used for different applications. Various transistor types include, for example, bipolar junction transistors (BJT), junction field-effect transistors (JFET), metal-oxide-semiconductor field-effect transistors (MOSFET), vertical channel or trench field-effect transistors, and superjunction or multi-drain transistors. One type of transistor that has emerged within the MOSFET family of transistors is a fin field-effect transistor (FinFET).

A FinFET can be fabricated on a bulk semiconductor substrate, e.g., a silicon substrate, and comprise a fin-like structure that runs in a length direction along a surface of the substrate and extends in a height direction normal to the substrate surface. The fin has a narrow width, e.g., less than 250 nanometers. The fin can pass through an insulating layer. A gate structure comprising a conductive gate material and gate insulator can be formed over a region of the fin. Upper portions of the fin are doped on either side of the gate structure to form source/drain regions adjacent to the gate.

FinFETs have favorable electrostatic properties for complimentary MOSFET scaling to smaller sizes. Because the fin is a three-dimensional structure, the transistors channel can be formed on three surfaces of the fin, so that the FinFET can exhibit a high current switching capability for a given surface area occupied on substrate. Since the channel and device can be raised from the substrate surface, there can be reduced electric field coupling between adjacent devices as compared to conventional planer MOSFETs.

A key challenge in semiconductor design, manufacture, and operation is contact resistance. For example, the source and drain regions of FinFET device may be eroded by the etch process for forming the source/drain contact trench, leading to increased contact resistance. A result of increased contact resistance is decreased performance of circuit devices, including transistors and other device structures formed on a semiconductor substrate.

Therefore, there is a need for contacts with decreased contact resistance.

SUMMARY

Embodiments of the present disclosure generally relate to processing systems and methods for forming a contact. The processing system includes a plurality of process chambers configured to deposit, etch, and/or anneal a source/drain region of a substrate. The method includes depositing a doped semiconductor layer over a source/drain region, forming an anchor layer in a trench, and depositing a conductor in the trench. The method of forming a contact results in reduced contact resistance by using integrated processes, which allows various operations of the source/drain contact formation to be performed within the same processing system.

In one embodiment, a processing system is provided, including a system controller, a first process chamber, a second process chamber, and a fourth process chamber. The controller is configured to cause the first process chamber to deposit a doped semiconductor layer and a metal silicide layer on an exposed surface of a source/drain region of a substrate. The source/drain region is exposed through a trench formed in a dielectric material formed over the source/drain region. The controller is configured to cause the second process chamber to form an anchor layer over the metal silicide layer and sidewalls of the trench. The controller is configured to cause the third process chamber to fill the trench with a conductor. The controller is configured to cause the fourth process chamber to heat the substrate to reflow the conductor within the trench. The source/drain region has a first dopant concentration. The doped semiconductor layer has a second dopant concentration higher than the first dopant concentration.

In another embodiment, a processing system is provided, including a plurality of process chambers. The plurality of process chambers include a first process chamber configured to remove contaminant from an exposed surface of a source/drain region of a substrate, wherein the source/drain region is exposed through a trench formed in a dielectric material formed over the source/drain region, a second process chamber configured to deposit sequentially a doped semiconductor layer and a metal silicide layer over the source/drain region, a third process chamber configured to deposit a barrier layer on the metal silicide layer and sidewalls of the trench, a fourth process chamber configured to deposit an anchor layer over the barrier layer, a fifth process chamber configured to fill the trench with a conductor, a sixth process chamber configured to deposit an overburden layer over the conductor, and a seventh process chamber configured to heat the substrate to reflow the conductor within the trench. The source/drain region has a first dopant concentration. The doped semiconductor layer has a second dopant concentration higher than the first dopant concentration.

In yet another embodiment, a method of forming a contact is provided, including depositing a doped semiconductor layer on an exposed surface of a source/drain region of a substrate, wherein the source/drain region is exposed through a trench formed in a dielectric material formed over the source/drain region, depositing a metal silicide layer on the doped semiconductor layer, forming an anchor layer over the metal silicide layer and sidewalls of the trench, filling the trench with a conductor, and heating the substrate such that the conductor reflows within the trench. The source/drain region has a first dopant concentration. The doped semiconductor layer has a second dopant concentration higher than the first dopant concentration.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments disclosed herein include a processing system and a method of forming a contact. In various embodiments, the method includes performing the following operations in a processing system without breaking vacuum: performing a pre-clean process on an exposed surface of a source/drain region of a transistor of a substrate, the source/drain region is exposed through a trench formed in a dielectric material formed over the source/drain region, forming a silicide layer on the exposed source/drain region by an epitaxial deposition process, forming a barrier/liner layer over the silicide layer by an atomic layer deposition process, forming an anchor layer on the barrier/liner layer by a physical vapor deposition process, filling the trench with a conductor by a chemical vapor deposition process, and annealing the substrate. The integrated process can form cobalt contacts with reduced resistance and voids, thereby providing high-performance logic transistor. Embodiments disclosed herein may be useful for, but are not limited to, creating a contact with decreased contact resistance.

The foregoing broadly outlines techniques described in this disclosure. It is contemplated that the concepts of the present disclosure may be implemented for a planar transistor device or for a three-dimensional transistor device, such as fin field effect transistors (FinFETs), horizontal gate all around (HGAA) FETs, vertical gate all around (VGAA) FETs, nanowire channel FETs, strained-semiconductor devices, etc.

As used herein, the term "about" refers to a +/−10% variation from the nominal value. It is to be understood that such a variation can be included in any value provided herein.

Figure 1:
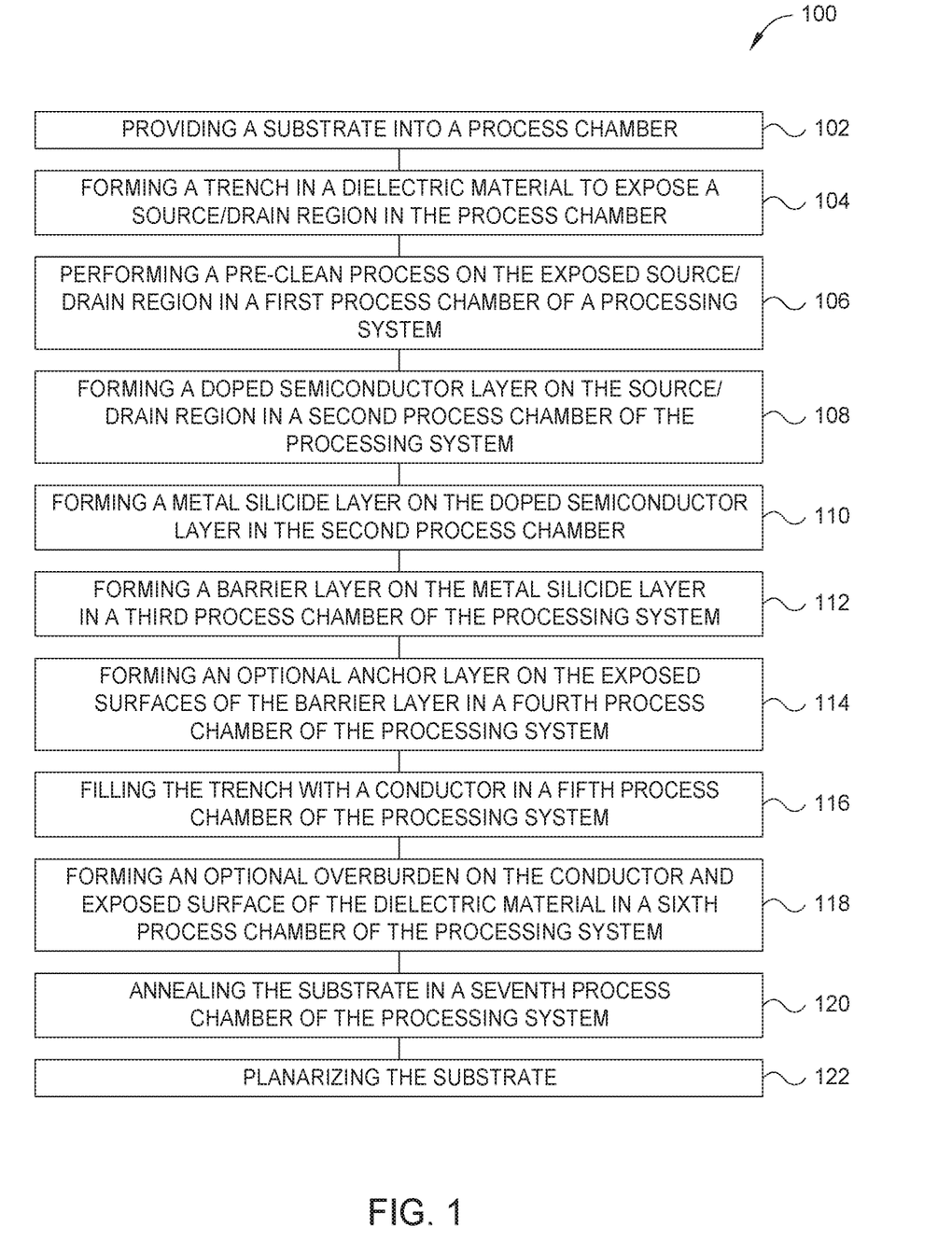
FIG. 1 is a flow diagram of method operations for forming a contact, according to one embodiment.

FIG. 1 is a flow diagram of method 100 operations for forming a contact, according to one embodiment. FIGS. 2A-2D illustrate various views of a substrate 200 during different stages of the method 100, according to one embodiment. Although the method 100 operations are described in conjunction with FIGS. 1 and 2A-2D, persons skilled in the art will understand that any system configured to perform the method operations, in any order, falls within the scope of the embodiments described herein. It is noted that the method 100 can be utilized to form any other semiconductor structures not presented herein. Those skilled in the art should recognize that a full process for forming a semiconductor device and the associated structures are not illustrated in the drawings or described herein. The contact can be part of a transistor or other semiconductor device.

Figure 2A:
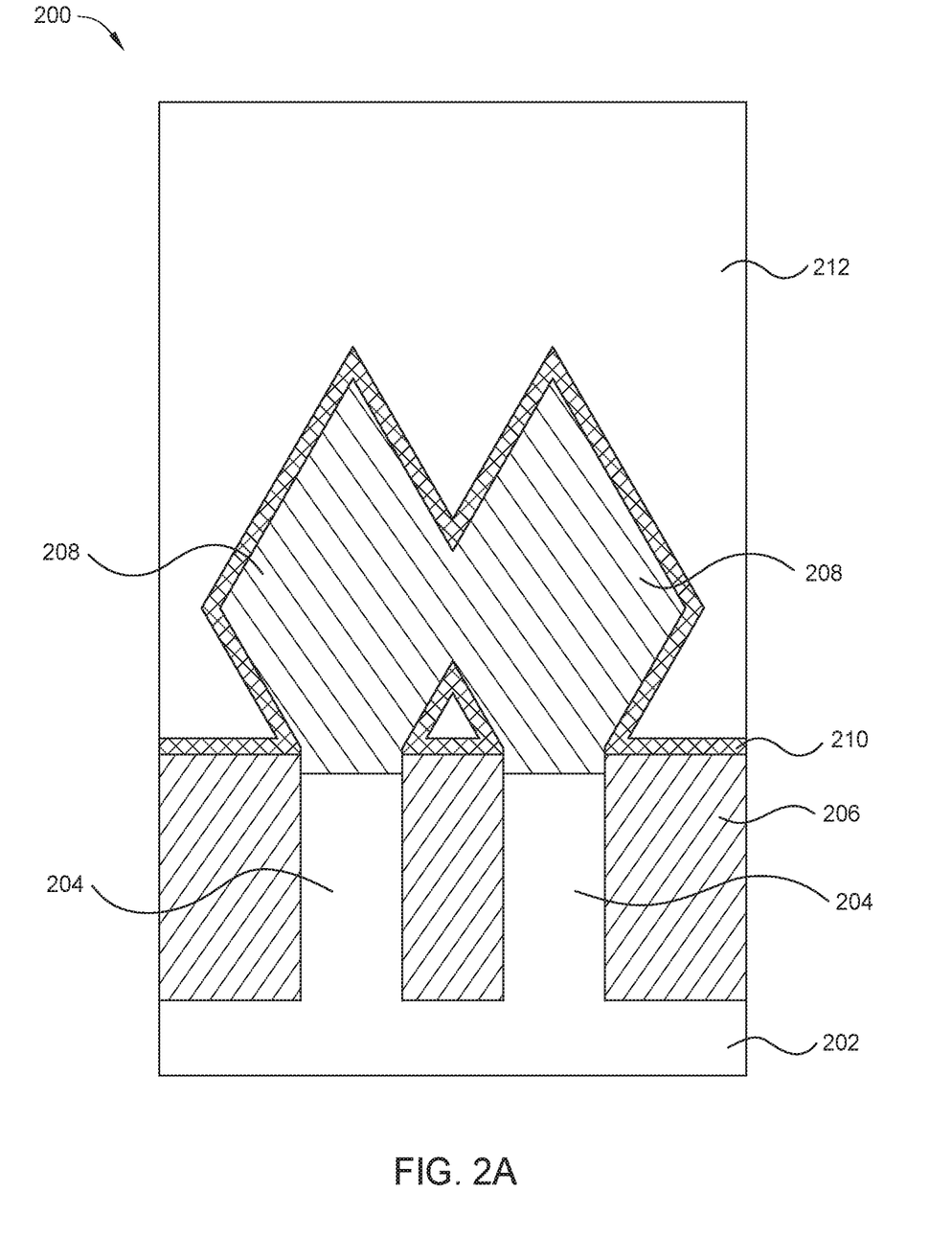
FIGS. 2A-2D illustrate various views of a substrate during different stages of a method of FIG. 1, according to one embodiment.

The method 100 begins at operation 102 by providing the substrate 200 into a process chamber. The process chamber can be an etch chamber. The substrate 200 is any used in the art, and includes any semiconducting, insulating, or metallic material. As illustrated in FIG. 2A, the substrate 200 includes a semiconductor layer 202, a plurality of semiconductor structures 204, a first dielectric material 206, a source/drain region 208, contact etch stop layers (CESL) 210, and a second dielectric material 212. The plurality of semiconductor structures 204 (only two are shown) extend from the semiconductor layer 202. The semiconductor structures 204 can be semiconductor fins. The semiconductor layer 202 can be fabricated from silicon (Si), germanium (Ge), silicon germanium (SiGe), or group III/V compound semiconductors, such as gallium arsenide (GaAs) or indium gallium arsenide (InGaAs). The semiconductor layer 202 can be doped with a p-type or an n-type dopant. In one embodiment, the semiconductor layer 202 is doped with a p-type dopant, such as boron (B). In another embodiment, the semiconductor layer 202 is doped with an n-type dopant, such as phosphorus (P) or arsenic (As). The semiconductor structures 204 are fabricated from the same material as the semiconductor layer 202. In one embodiment, the semiconductor structures 204 are integrated with the semiconductor layer 202.

The first dielectric material 206 is disposed between the semiconductor structures 204 on the semiconductor layer 202. The first dielectric material 206 can be shallow trench isolation (STI) regions, and can be fabricated from silicon dioxide ($SiO_2$), silicon nitride ($Si_3N_4$), silicon carbonitride (SiCN), or other suitable dielectric material.

In one example, the source/drain region 208 is a source region or a drain region. In another example, the source/drain region 208 includes a merged source/drain region, as illustrated in FIG. 2A. In either example, the source/drain region 208 is fabricated from a semiconductor material that is grown epitaxially on the semiconductor structures 204. The source/drain region 208 is fabricated from Si, Ge, SiGe, or group III/V compound semiconductors, such as GaAs or InGaAs. The source/drain region 208 can be doped with a p-type or an n-type dopant. In one example, the source/drain region 208 is doped with a p-type dopant, such as B. Alternatively, the source/drain region 208 is doped with an n-type dopant, such as P or As. The source/drain region 208 can be grown epitaxially on the semiconductor structure 204, and because of the different growth rate on different surface planes, facets can be formed to cause the source/drain region 208 to have a diamond shape.

CESL 210 are formed on the first dielectric material 206 and the source/drain region 208. CESL 210 are fabricated from a dielectric material, such as $SiO_2$, $Si_3N_4$, SiCN, or a combination thereof. The second dielectric material 212 is disposed over the CESL 210. The second dielectric material 212 can be an interlayer dielectric, and can be fabricated from a dielectric material, such as $SiO_2$, $Si_3N_4$, SiCN, or a combination thereof. The substrate 200 can further include a plurality of gates (not shown) disposed over and extending perpendicularly to the semiconductor structures 204.

Figure 2B:
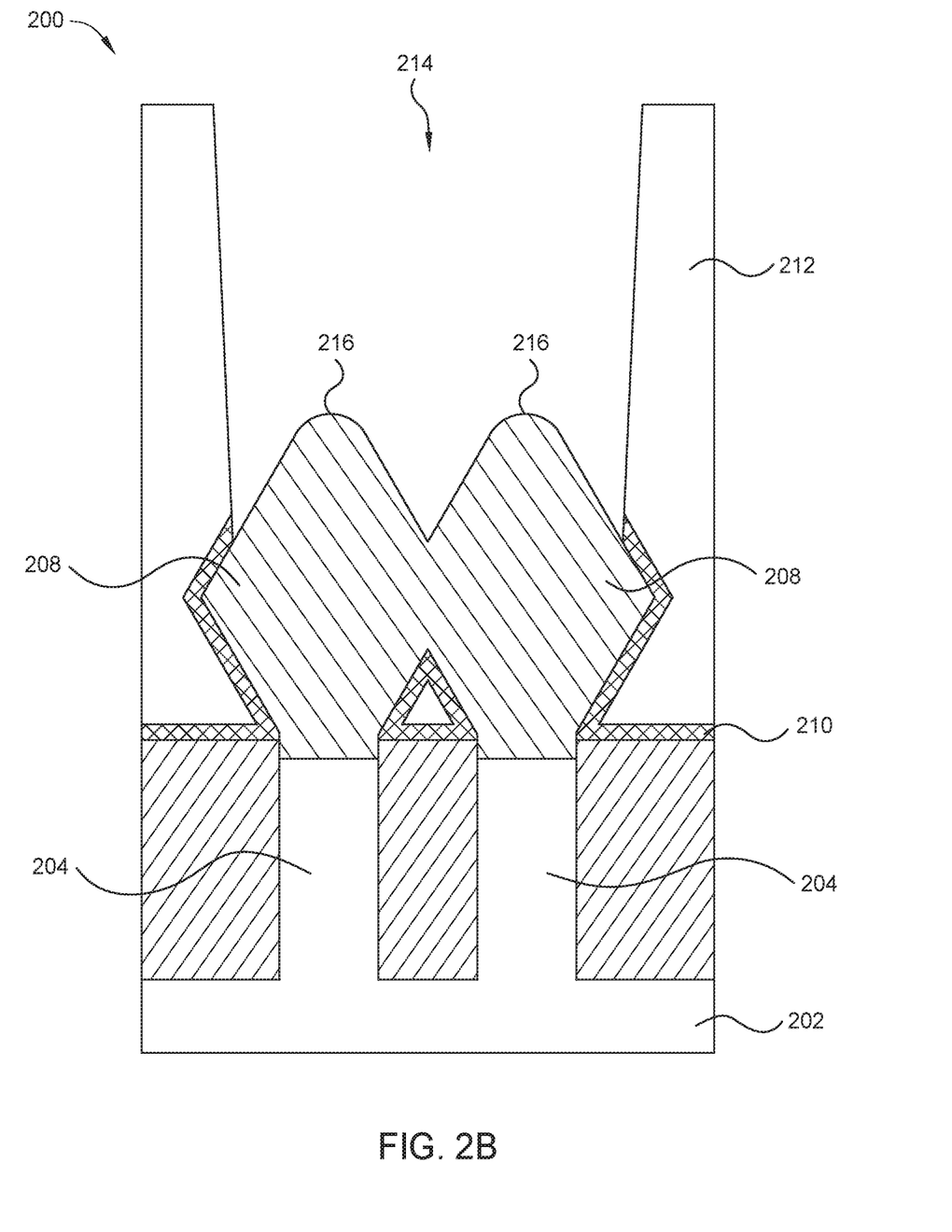

At operation 104, a trench 214 is formed in the second dielectric material 212 to expose each source/drain region 208, as illustrated in FIG. 2B. The trench 214 is formed by removing a portion of the second dielectric material 212 and the CESL 210 disposed over each source/drain region 208, and a surface 216 of each source/drain region 208 is exposed. The trench 214 can be formed by any suitable removal process. In one example, the trench 214 is formed by plasma etch process.

A single source/drain region 208 is exposed in each trench 214. Alternatively, a merged source/drain region 208 is exposed in each trench 214, as illustrated in FIG. 2B. A portion of the source/drain region 208 can be removed during the formation of the trench 214. The eroded source/drain region 208 has an increased contact resistance. The trench 214 is formed in the process chamber, which can be a reactive ion etch (RIE) chamber or other suitable etch chamber.

At operation 106, a pre-clean process is performed on the exposed surface 216 of the source/drain region 208. The pre-clean process removes any contaminant, such as carbon or oxide contaminant, on the surface 216 of the source/drain region 208. The pre-clean process can be any suitable etch process, such as dry etch, wet etch, or a combination thereof. In one example, the pre-clean process includes a wet etch process followed by a dry etch process. The wet etch process can utilize ammonia ($NH_3$) or hydrogen fluoride (HF) solution. The dry etch process can be a plasma etch process and can utilize a fluorine- or hydrogen-containing etchant. The pre-clean process does not substantially remove any portion of the source/drain region 208.

The pre-clean process is performed in a first process chamber of a processing system, which can be the same or different processing system as the process chamber from operations 102 and 104. In one example, the pre-clean process is performed in a process chamber using a remote plasma source. One example process chamber suitable for performing the pre-clean process is an AKTIV Pre-Clean™ chamber or a SiCoNi™ clean chamber available from Applied Materials, Inc., Santa Clara, Calif. Alternatively, the pre-clean process is performed in an etch chamber, such as an etch chamber using an inductively coupled plasma (ICP) source. One example etch chamber is a modified Decoupled Plasma Nitridation (DPN) chamber that is available from Applied Materials Inc., Santa Clara, CA. However, it is contemplated that other suitably configured chambers from other manufacturers can also be implemented to perform the pre-clean process.

Figure 2C:
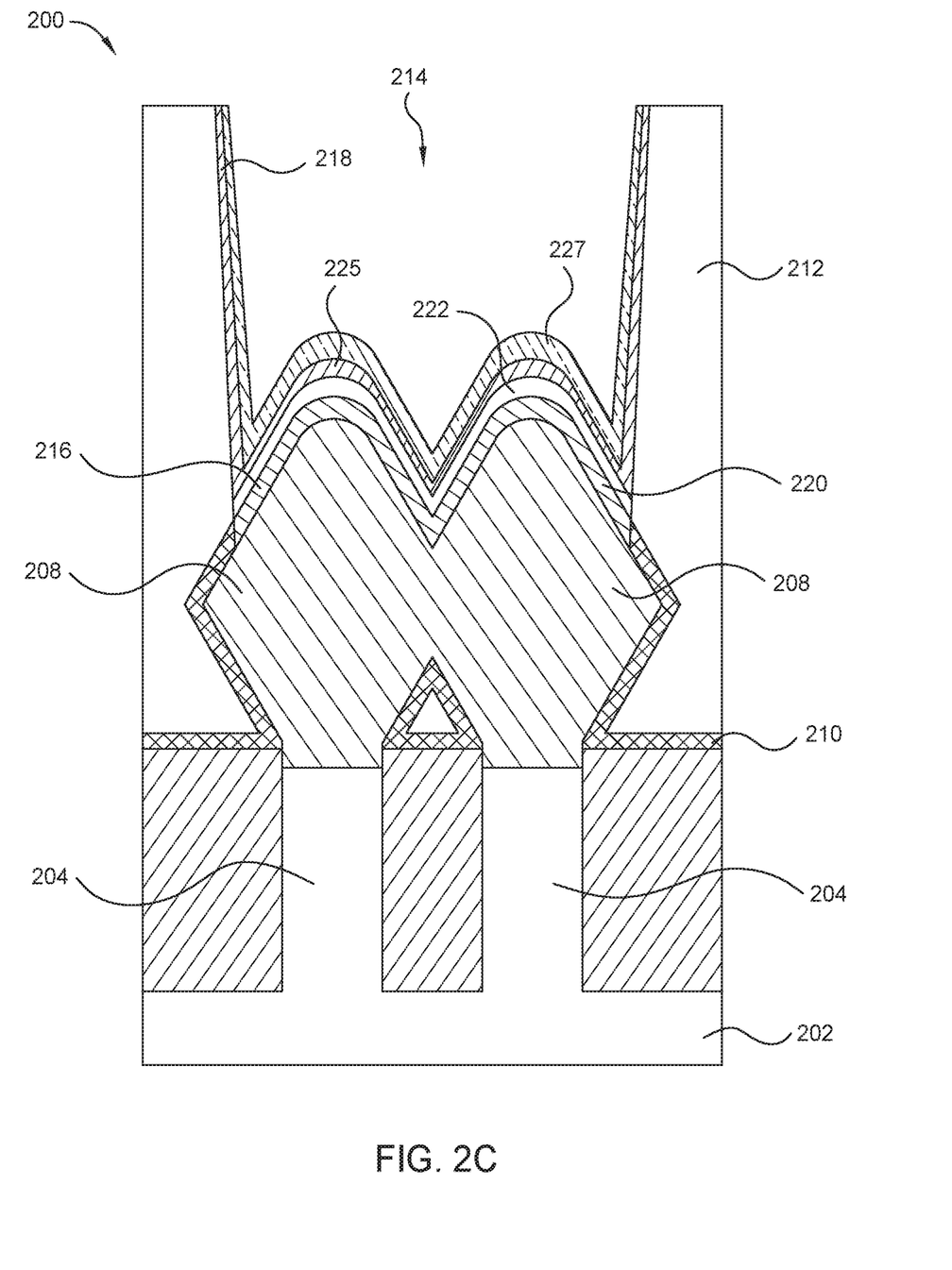

At operation 108, a doped semiconductor layer 220 is formed on the surfaces 216 of the exposed source/drain region 208, as illustrated in FIG. 2C. The doped semiconductor layer 220 can be formed by a selective epitaxial deposition process. The doped semiconductor layer 220 is formed on the exposed surface of the source/drain region 208, i.e., the bottom of the trench 214, and not on sidewalls 218 of the trench 214 as a result of the selective epitaxial deposition process. The doped semiconductor layer 220 can be fabricated from the same material as the source/drain region 208, with the exception that the dopant concentration in the doped semiconductor layer 220 is higher than the dopant concentration in the source/drain region 208. In one embodiment, the doped semiconductor layer 220 is formed by a dopant soak process. During the dopant soak process, a top portion of the source/drain region 208, such as from the surface 216 to a predetermined depth, is converted to the doped semiconductor layer 220. The doped semiconductor layer 220 can have a thickness ranging from about 1 Å to about 200 Å. In one embodiment, the ratio of the dopant concentration in the doped semiconductor layer 220 to the dopant concentration in the source/drain region 208 is in a range from about 1.5:1 to about 10:1, for example, about 2:1 to about 6:1. In one example, the dopant concentration in the doped semiconductor layer 220 is about $1\times10^{19}$ atoms/$cm^3$ to about $1\times10^{22}$ atoms/$cm^3$. Increased dopant concentration in the doped semiconductor layer 220 decreases contact resistance.

The selective epitaxial deposition process is performed in a second process chamber of the processing system. In one embodiment, the doped semiconductor layer 220 is formed in an epitaxial chamber. One example of the epitaxial chamber is a reduced pressure (RP) Epi chamber available from Applied Materials, Inc., Santa Clara, Calif. However, it is contemplated that other suitably configured chambers from other manufacturers can also be implemented to perform the selective epitaxial deposition or the dopant soak process to form the doped semiconductor layer 220.

At operation 110, a metal silicide layer 222 is formed on the doped semiconductor layer 220 by a selective epitaxial deposition process, as illustrated in FIG. 2C. The metal silicide layer 222 is formed on the doped semiconductor layer 220, i.e., the bottom of the trench 214, and not on sidewalls 218 of the trench 214 as a result of the selective epitaxial deposition process. The metal silicide layer 222 can include titanium silicide (TiSi), cobalt silicide (CoSi), ruthenium silicide (RuSi), or other suitable metal silicide. The metal silicide layer 222 can be formed in the same process chamber as the doped semiconductor layer 220.

Figure 3:
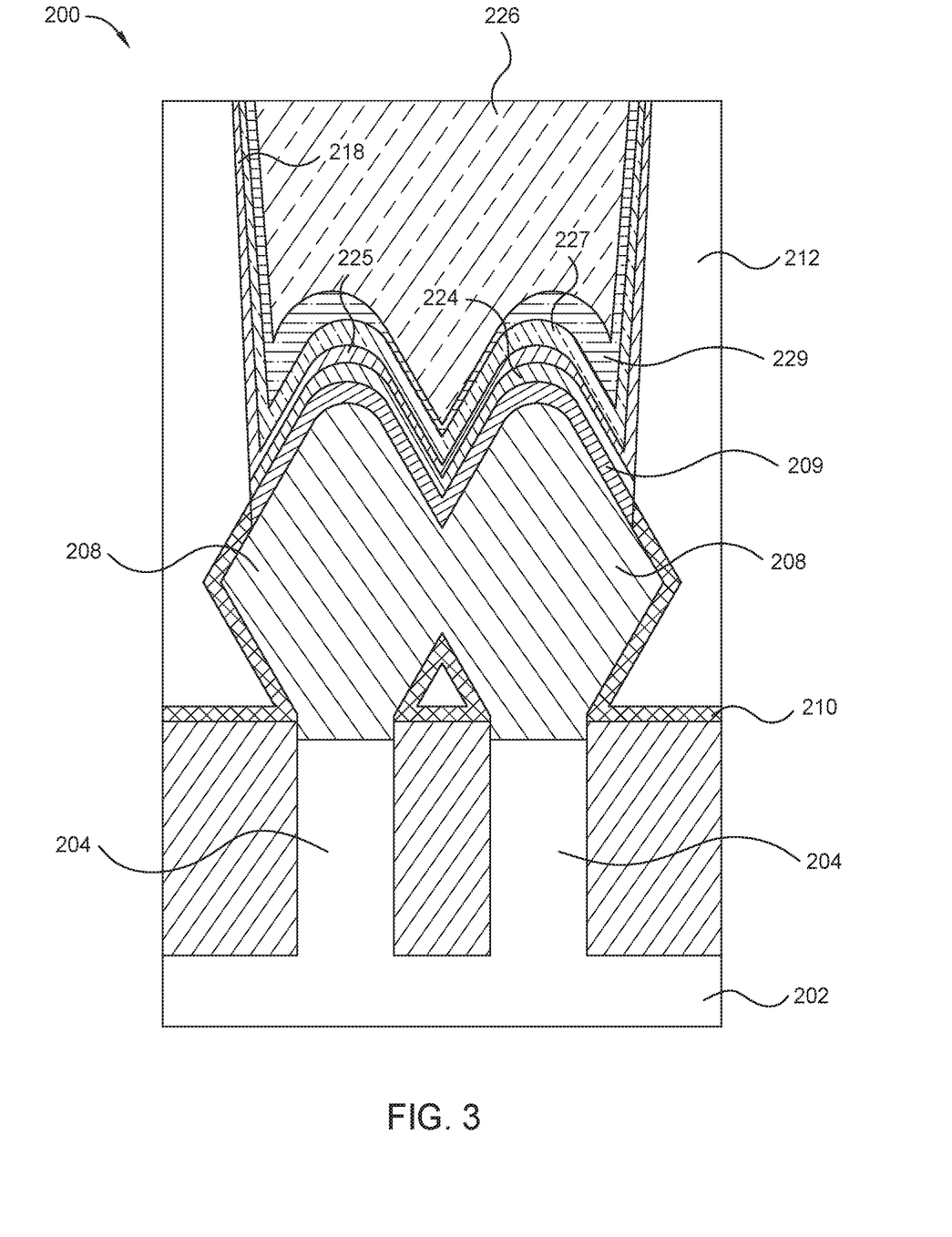
FIG. 3 illustrates a cross-sectional view of a substrate, according to one embodiment.

Alternatively, the doped semiconductor layer 220 and the metal silicide layer 222 can be replaced by a silicide layer 209 that is formed on the surfaces of the exposed source/drain region 208, as illustrated in FIG. 3. In one embodiment, the silicide layer 209 is formed by forming a conformal metal layer on the surface of the exposed source/drain region 208 and over the surface 216 of the second dielectric material 212. The conformal metal layer can be a refractory metal layer formed using a CVD process, a PECVD process, a high-density CVD process, a PVD process, a plating process, a sputtering process, an evaporation process, or any suitable process. The metal layer can include cobalt (Co), nickel (Ni), titanium (Ti), ruthenium (Ru), tantalum (Ta), tungsten (W), alloys thereof, other suitable metal silicides, or any combination thereof. Some examples of the metal layer include, but are not limited to, TiSi, RuSi, nickel platinum (NiPt) alloy, nickel palladium (NiPd), nickel rhenium (NiRe), titanium tantalum (TiTa), or titanium niobium (TiNb).

Once the metal layer has been formed, the substrate 200 is then heated, such as by an annealing process, so that the exposed source/drain region 208 reacts with the metal layer and forms the silicide layer 209. The annealing process causes the silicide reaction to occur wherever the metal layer is in contact with the source/drain regions 208. Depending upon the metal layer used, the silicide layer 209 can be silicide of the metal layer. For example, if the metal layer includes Co, the silicide layer 209 includes CoSi. The annealing process can be performed in a rapid thermal annealing (RTA) chamber. One example chamber is a Vantage® RADOX™ RTP chamber available from Applied Materials, Inc., Santa Clara, Calif., or other suitable chamber. The un-reacted metal layer is then removed by a selective etch process to leave the silicide layer 209 on the substrate.

In embodiments where the silicide layer 209 is utilized, an optional cap layer 224 can be formed on the silicide layer 209, as illustrated in FIG. 3. While not shown, the cap layer 224 can also be formed on the metal silicide layer 222, making the cap layer 224 disposed between the metal silicide layer 222 and a barrier layer 225 (alternatively referred to as a liner layer) and/or an anchor layer 227 to be subsequently formed on the cap layer 224. The cap layer 224 can prevent the metal from a subsequently deposited anchor layer 227 and/or the contact metal subsequently filled in the trench 214 from diffusing and reacting with the underlying silicide layer 209 and/or the source/drain regions 208. The cap layer 224 can also serve as an adhesion layer to improve the adhesion between the contact metal subsequently filled in the trench 214 and the silicide layer 209.

The cap layer 224 can be a nitride layer. The nitride layer can include, but is not limited to, TiN, $Si_3N_4$, or a metal silicon nitride. The cap layer 224 can include a metallic material containing a transition metal, such as iridium (Ir) or molybdenum (Mo). In one embodiment, the cap layer 224 is a nitride layer formed by a nitridation process. The nitridation process can include exposing the exposed silicide layer 209 to a nitrogen-containing plasma or a nitrogen-containing ambient environment so that nitrogen (N) atoms chemically react with atoms residing at the exposed surface of the silicide layer 209 to form a surface nitride layer (e.g., the cap layer 224). In some embodiments, a nitride region is also formed in the upper portion of the source/drain regions 208.

The nitridation process can be performed in a plasma chamber using an inductively coupled plasma (ICP) source, such as the modified Decoupled Plasma Nitridation (DPN) chamber available from Applied Materials, Inc., Santa Clara, Calif., or other suitable chamber. It is contemplated that the cap layer 224 can also be formed by any suitable deposition process, such as an ALD process, a CVD process, a PECVD process, a HDP-CVD process, a low-pressure CVD (LPCVD) process, a PVD process, or any suitable deposition technique. In cases where the cap layer 224 is formed by the ALD process, the cap layer 224 can form on both the sidewalls 218 and the silicide layer 209. In such a case, the deposition of the cap layer 224 can be performed in an ALD chamber. One example of the ALD chamber is an Olympia™ ALD chamber available from Applied Materials, Inc., Santa Clara, Calif., although other suitable chambers can be utilized.

At operation 112, the optional barrier layer 225 is formed on the metal silicide layer 222 and the sidewalls 218 of the trench 214, as illustrated in FIG. 2C. In embodiments where the cap layer 224 is disposed on the metal silicide layer 222, the barrier layer 225 is formed on the cap layer 224, resulting in the cap layer 224 disposed between the metal silicide layer 222 and the barrier layer 225. FIG. 3 illustrates an example where the barrier layer 225 is formed on the cap layer 224 and the sidewalls 218 of the trench 214.

The barrier layer 225 can be fabricated from the same material as the cap layer 224. In one embodiment, the barrier layer 225 includes TiN. The barrier layer 225 can be formed by any suitable deposition process, such as an ALD process, a CVD process, a PECVD process, a HDP-CVD process, a low-pressure CVD (LPCVD) process, a PVD process, or any suitable deposition technique. The deposition of the barrier layer 225 is performed in a third process chamber of the processing system. In one embodiment, the barrier layer 225 is formed by an ALD process. One example chamber is an Olympia™ ALD chamber available from Applied Materials, Inc., Santa Clara, Calif., or other suitable chambers can be utilized. Alternatively, the barrier layer 225 can be formed in the same process chamber as the cap layer 224.

At operation 114, the anchor layer 227 is optionally formed on the exposed surfaces of the barrier layer 225, as shown in FIGS. 2C and 3. In embodiments where the barrier layer 225 was not used, the anchor layer 227 is formed on the metal silicide layer 222 (FIG. 2C) or the cap layer 224 (FIG. 3). The anchor layer 227 further improves the adhesion between the contact metal subsequently filled in the trench 214 and the silicide layer 209 and/or the source/drain regions 208. The anchor layer 227 can be fabricated from a metal, such as Co, W, Cu, Ru, aluminum (Al), gold (Au), silver (Ag), alloys thereof, the like, or a combination thereof, and can be deposited by a CVD process, an ALD process, a PVD process, an ECP process, or any suitable deposition technique.

The deposition of the anchor layer 227 is performed in a fourth process chamber of the processing system. In one embodiment, the anchor layer 227 is formed in a PVD chamber. One example chamber is a Cirrus™ RT PVD chamber available from Applied Materials, Inc., Santa Clara, Calif. However, it is contemplated that other suitably configured chambers from other manufacturers can also be implemented to perform the deposition process to form the anchor layer 227.

Figure 2D:
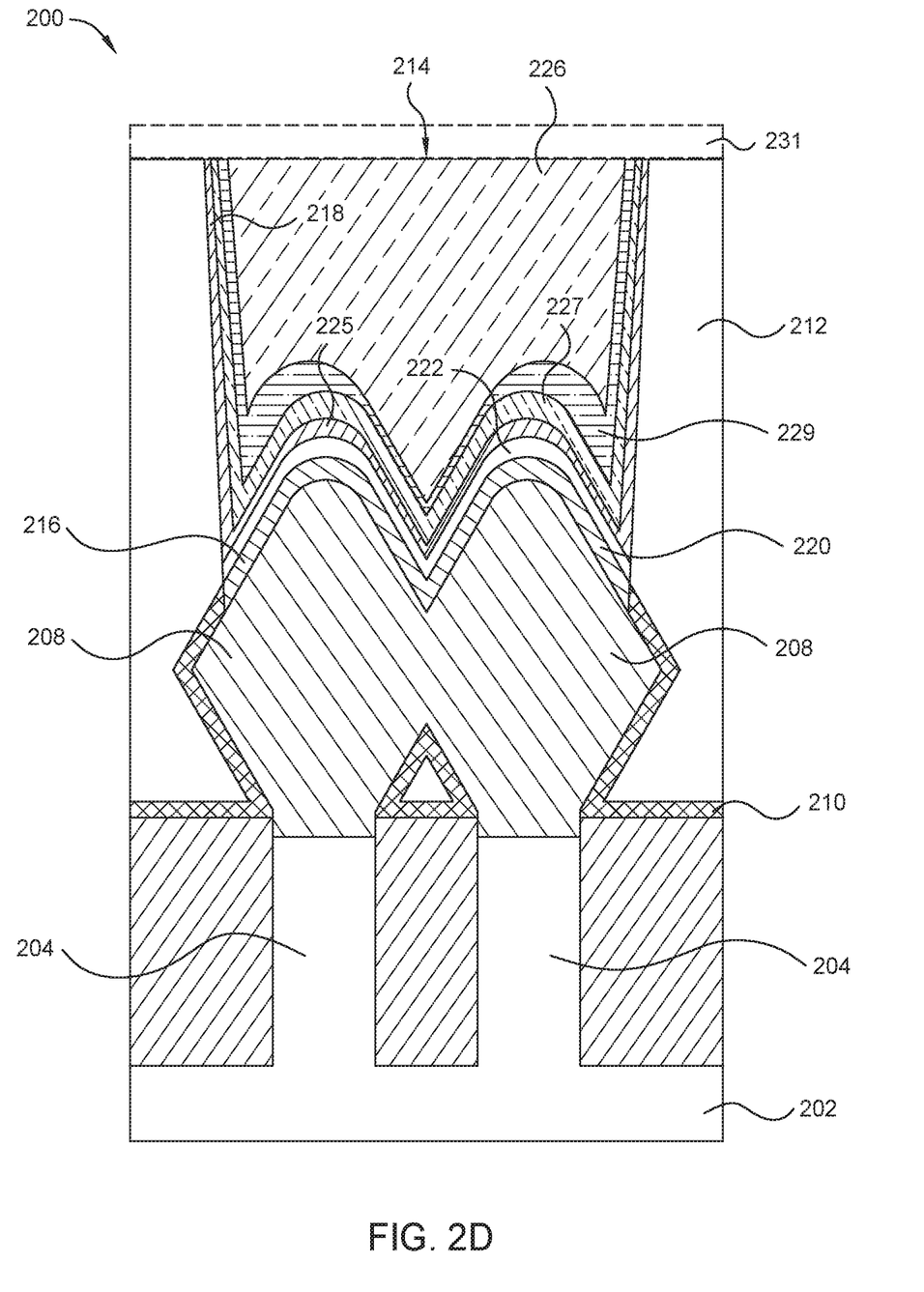

At operation 116, a conductor 226 is formed in the trench 214 to fill the trench 214, as illustrated in FIGS. 2D and 3. A seed layer 229 can be disposed between the anchor layer 227 and the conductor 226. The seed layer 229 can be formed on the exposed surfaces of the anchor layer 227, as illustrated in FIG. 2D. The seed layer 229 and the conductor 226 can be fabricated from the same or different material. Suitable material for the conductor 226 and the seed layer 229 include, but are not limited to, Co, Cu, W, Al, Ru, Ti, Ag, platinum (Pt), palladium (Pa), alloys thereof, derivatives thereof, or any combinations thereof. In one embodiment, the conductor 226 is fabricated from Co. The conductor 226 and the seed layer 229 can be formed on the anchor layer 227 using one or more deposition processes, such as a CVD process, a PECVD process, an ALD process, a PEALD process, a PVD process, a plating process, an ECP process, or any suitable deposition technique.

The formation of the conductor 226 is performed in a fifth process chamber of the processing system. In one embodiment, the conductor 226 is formed in a CVD chamber. One example chamber is a Volta™ CVD chamber available from Applied Materials, Inc., Santa Clara, Calif. However, it is contemplated that other suitably configured chambers from other manufacturers can also be implemented to perform the deposition process to form the conductor 226.

At operation 118, in some embodiments, after the trench 214 is filled with the conductor 226, an overburden layer 231 is formed on the conductor 226 and the exposed surface of the second dielectric material 212. The overburden layer 231 can include a metal, which can include the same material as the conductor 226. In one embodiment, the overburden layer 231 include Co. The overburden layer 231 can be formed on the conductor 226 and the exposed surface of the second dielectric material 212 until a predetermined thickness is reached. After the overburden layer is formed, the substrate 200 is heated to a predetermined temperature by the thermal annealing process discussed above to reflow the metal of the overburden layer 231 and the conductor 226, thereby eliminating seams or voids in the conductor 226. Alternatively, the thermal annealing process can be performed prior to the formation of the overburden layer.

The overburden layer 231 can be formed by any suitable deposition technique, such as a PVD process, an ALD process, a CVD process, a PECVD process, a HDP-CVD process, a low-pressure CVD (LPCVD) process, etc. The deposition of the overburden layer 231 can be performed in a sixth process chamber of the processing system. In one embodiment, the overburden layer 231 is formed in a PVD chamber. One example chamber is a Versa™ XT PVD chamber available from Applied Materials, Inc., Santa Clara, Calif. Alternatively, the deposition of the overburden layer can be performed in the fourth process chamber of the processing system. However, it is contemplated that other suitably configured chambers from other manufacturers can also be implemented to perform the deposition process to form the overburden layer.

At operation 120, the substrate 200 is heated to a predetermined temperature during a thermal annealing process. The thermal annealing process can be performed in a temperature range from about 200° C. to about 800° C., for example, about 300° to about 600° C. During the thermal annealing process, the metal of the conductor 226 within the trench 214 can reflow to eliminate seams or voids in the conductor 226. The overburden layer 231 can also reflow to further fill the trench 214 if there were any seams or voids left in the conductor 226. The thermal annealing process can also enlarge the grain size, purify the conductor 226 (e.g., Co), and/or reduce the resistance. As a result, a high quality, void-free conductor 226 is obtained.

The thermal annealing process is performed in a seventh process chamber of the processing system. In one embodiment, the thermal annealing process is performed in an anneal chamber. One example chamber is a Pyra™ Anneal chamber available from Applied Materials, Inc., Santa Clara, Calif. Another example chamber is a rapid thermal annealing (RTA) chamber, such as the Vantage® RADOX™ RTP chamber available from Applied Materials, Inc., Santa Clara, Calif. However, it is contemplated that other suitably configured chambers from other manufacturers can also be implemented to perform the thermal annealing process.

At operation 122, the excess conductor 226 (and the overburden layer 231, if used) can be removed by using a planarization process, such as a chemical mechanical polishing (CMP). The planarization process removes the overburden layer 231 and excess conductor 226 from above a top surface of the second dielectric material 212. Hence, top surfaces of the conductor 226, the seed layer 229 (if used), the anchor layer 227, the barrier layer 225, and the second dielectric material 212 can be coplanar. The conductive features as formed can be referred to as contacts, plugs, etc. The substrate 200 can be subjected to further processes that are used to complete a transistor.

In one embodiment, the planarization process is performed in CMP system. One example system is a Reflexion® LK Prime™ CMP system available from Applied Materials, Inc., Santa Clara, Calif. However, it is contemplated that other suitably configured CMP systems from other manufacturers can also be implemented to perform the deposition process to form the conductor 226.

Examples of a processing system that can be suitably modified in accordance with the teachings provided herein include the Endura®, Producer® or Centura® integrated processing systems or other suitable processing systems commercially available from Applied Materials, Inc., located in Santa Clara, Calif. It is contemplated that other processing systems (including those from other manufacturers) can be adapted to benefit from aspects described herein.

Figure 4:
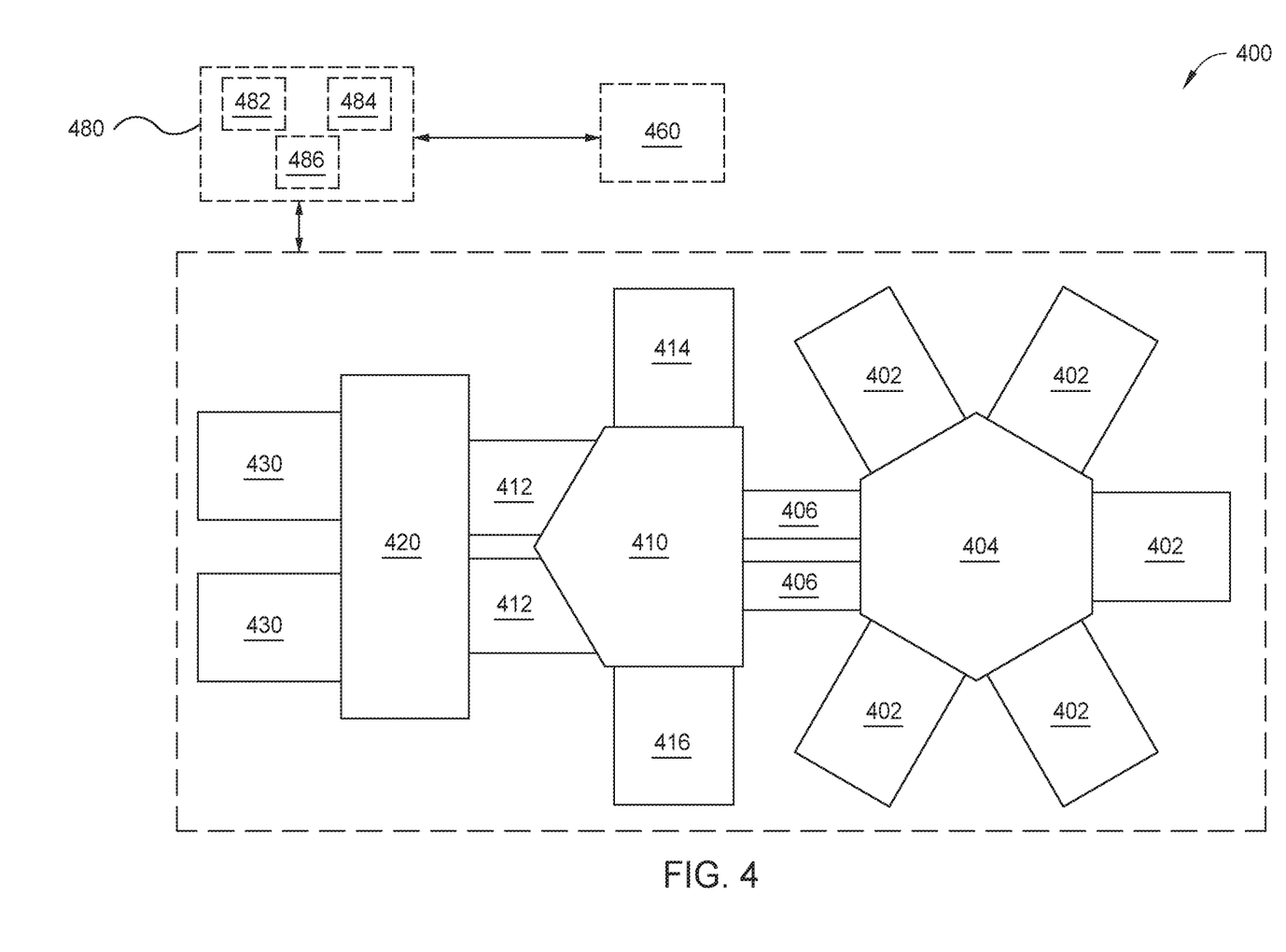
FIG. 4 illustrates a schematic top-view diagram of a multi-chamber processing system, according to one embodiment.

FIG. 4 illustrates a schematic top-view diagram of a multi-chamber processing system 400, according to one embodiment. The multi-chamber processing system 400 is configured to perform a variety of semiconductor processing methods on one or more substrates, such as method 100 described above. As shown, the multi-chamber processing system 400 includes a plurality of process chambers 402, 414, 416, a first transfer chamber 404, pass-through chambers 406, a second transfer chamber 410, load lock chambers 412, a factory interface 420, one or more pods 430, and a system controller 480.

Each of the process chambers 402 is coupled to the first transfer chamber 404. The first transfer chamber 404 is also coupled to the first pair of pass-through chambers 406. The first transfer chamber 404 has a centrally disposed transfer robot (not shown) for transferring substrates between the pass-through chambers 406 and the process chambers 402. The pass-through chambers 406 are coupled to the second transfer chamber 410, which is coupled to the process chamber 414 that is configured to perform pre-clean process (operation 106) and a process chamber 416 that is configured to perform a silicide layer (operations 108/110). The second transfer chamber 410 has a centrally disposed transfer robot (not shown) for transferring substrates between the load lock chambers 412 and the process chamber 414 and/or the process chamber 416. The factory interface 420 is connected to the second transfer chamber 410 by the load lock chambers 412. The factory interface 420 is coupled to the one or more pods 430 on the opposite side of the load lock chambers 412. The pods 430 typically are front opening unified pods (FOUP) that are accessible from a clean room.

In some embodiments, a substrate is provided to an etch chamber, to perform the trench formation process (e.g., operation 104). The etch chamber can be part of the multi-chamber processing system 400, or the etch chamber can be part of a separate processing tool. The substrate is then transferred to the process chamber 414. The substrate is transferred to the pods 430 before being transferred to the process chamber 414, according to one embodiment.

The substrate is transferred to the process chamber 414, where a pre-clean process (e.g., operation 106) is performed to remove contaminant, such as carbon or oxide contaminant from exposed surface of a source/drain region of a transistor of the substrate. Then, the substrate is transferred to the process chamber 416, where a doped semiconductor layer and a metal silicide layer are deposited (e.g., operations 108 and 110) (or in an alternative embodiment a silicide layer 209 is deposited). In some embodiments, the process chamber 414 and/or process chamber 416 are switched with any of the one or more process chambers 402.

The substrate is then transferred to the one or more process chambers 402, in which a barrier layer is deposited (e.g., operation 112, such as ALD of TiN barrier layer), an anchor layer is deposited (e.g., operation 114, such as PVD of Co anchor layer), a trench is filled with a conductor (e.g., operation 116, such as CVD Co conductor), an overburden layer is deposited (e.g., operation 118, such as PVD overburden layer), and anneal process is performed on the substrate (e.g., operation 120). Because all these operations 106, 108, 110, 112, 114, 116, 118, and 120 are performed within the same processing system, vacuum is not broken as the substrate is transferred to various chambers, which decreases the chance of contamination and improves the quality of the deposited epitaxial film.

A system controller 480 is coupled to the processing system 400. The system controller 480 controls the processing system 400 or components thereof. For example, the system controller 480 controls the operations of the processing system using a direct control of the chambers 402, 404, 406, 410, 412, 414, 416 and/or factory interface 420 and/or pod 430 of the processing system 400, or by controlling controllers associated with the chambers 402, 404, 406, 410, 412, 414, 416 and/or factory interface 420 and/or pod 430. In operation, the system controller 480 enables data collection and feedback from the respective chambers to coordinate performance of the processing system 400.

As shown, the system controller 480 includes a central processing unit (CPU) 482, memory 484, and support circuits 486. The CPU 482 can be one of any form of a general purpose processor that is used in an industrial setting. The memory 484 can include non-transitory computer-readable medium and/or machine-readable storage device. The memory 484 is accessible by the CPU 482 and can be one or more of memory such as random access memory (RAM), read only memory (ROM), floppy disk, hard disk, or any other form of digital storage, local or remote. The support circuits 486 are coupled to the CPU 482 and can include cache, clock circuits, input/output subsystems, power supplies, and the like. The system controller 480 is configured to perform method 100 operations stored in the memory 484. The various embodiments disclosed in this disclosure can generally be implemented under the control of the CPU 482 by executing computer instruction code stored in the memory 484 (or in memory of a particular process chamber) as, e.g., a computer program product or software routine. That is, the computer program product is tangibly embodied on the memory 484 (or non-transitory computer-readable medium or machine-readable storage device). When the computer instruction code is executed by the CPU 482, the CPU 482 controls the chambers to perform operations in accordance with the various embodiments.

As described above, methods of forming a contact and a processing system are provided herein. The processing system includes a plurality of process chambers configured to deposit, etch, and/or anneal a source/drain region of a substrate. The method includes depositing a doped semiconductor layer over a source/drain region, forming an anchor layer in a trench, and depositing a conductor in the trench.

The method of forming a contact results in reduced contact resistance by using integrated processes, which allows various operations of the source/drain contact formation to be performed within the same processing system. Therefore, vacuum is not broken while the substrate is transferred between various process chambers, which decreases the chance of contamination and improves the quality of the deposited layers.

While the foregoing is directed to embodiments of the present disclosure, other and further embodiments of the disclosure may be devised without departing from the basic scope thereof, and the scope thereof is determined by the claims that follow.

What is claimed is:

1. A processing system comprising:
   a system controller;
   a first process chamber, wherein the system controller is configured to cause the first process chamber to deposit a doped semiconductor layer and a metal silicide layer on an exposed surface of a source/drain region of a substrate, wherein the source/drain region is exposed through a trench formed in a dielectric material formed over the source/drain region, and the source/drain region has a first dopant concentration and the doped semiconductor layer has a second dopant concentration higher than the first dopant concentration;
   a second process chamber, wherein the system controller is configured cause the second process chamber to form an anchor layer over the metal silicide layer and sidewalls of the trench;
   a third process chamber, wherein the system controller is configured to cause the third process chamber to fill the trench with a conductor; and
   a fourth process chamber, wherein the system controller is configured to cause the fourth process chamber to heat the substrate to reflow the conductor within the trench.

2. The processing system of claim 1, wherein the first process chamber is an epitaxial chamber, the second process chamber is a physical vapor deposition (PVD) chamber, the third process chamber is a chemical vapor deposition (CVD) chamber, and the fourth process chamber is an anneal chamber.

3. The processing system of claim 1 further comprising:
   a fifth process chamber, wherein the system controller is configured to cause the fifth process chamber to deposit a barrier layer over the anchor layer.

4. The processing system of claim 3, wherein the system controller is configured to cause the fifth process chamber to deposit a cap layer over the metal silicide layer.

5. The processing system of claim 1, further comprising:
   a fifth process chamber, wherein the system controller is configured to cause the fifth process chamber to deposit a cap layer between the anchor layer and the metal silicide layer.

6. The processing system of claim 1, further comprising:
   a sixth process chamber, wherein the system controller is configured to cause the sixth process chamber to deposit an overburden layer over the conductor.

7. The processing system of claim 6, wherein the sixth process chamber is a physical vapor deposition (PVD) chamber.

8. The processing system of claim 6, wherein the anchor layer, the conductor, and the overburden layer comprise cobalt (Co).

9. A processing system comprising:
   a plurality of process chambers comprising:
      a first process chamber configured to remove contaminant from an exposed surface of a source/drain region of a substrate, wherein the source/drain region is exposed through a trench formed in a dielectric material formed over the source/drain region;
      a second process chamber configured to deposit sequentially a doped semiconductor layer and a metal silicide layer over the source/drain region, wherein the source/drain region has a first dopant concentration and the doped semiconductor layer has a second dopant concentration higher than the first dopant concentration;
      a third process chamber configured to deposit a barrier layer on the metal silicide layer and sidewalls of the trench;
      a fourth process chamber configured to deposit an anchor layer over the barrier layer;
      a fifth process chamber configured to fill the trench with a conductor;
      a sixth process chamber configured to deposit an overburden layer over the conductor; and
      a seventh process chamber configured to heat the substrate to reflow the conductor within the trench.

10. The processing system of claim 9, wherein the second process chamber is an epitaxial chamber, the third process chamber is an atomic layer deposition (ALD) chamber, the fourth process chamber is a physical vapor deposition (PVD) chamber, the fifth process chamber is a chemical vapor deposition (CVD) chamber, the sixth process chamber is a PVD chamber, and the seventh process chamber is an anneal chamber.

11. The processing system of claim 9 further comprising:
    a first transfer chamber coupled to one or more of the plurality of process chambers, the first transfer chamber configured to transfer the substrate to and receive the substrate from the one or more of the plurality of process chambers coupled to the first transfer chamber.

12. The processing system of claim 11, further comprising:
  a pass-through chamber coupled to the first transfer chamber; and
  a second transfer chamber coupled to the pass-through chamber.

13. The processing system of claim 9, wherein the anchor layer, the conductor, and the overburden layer comprise cobalt (Co).

14. The processing system of claim 9, wherein the third process chamber is configured to form a cap layer between the barrier layer and the metal silicide layer.

15. The processing system of claim 14, wherein the barrier layer and the cap layer comprise nitrogen (N).

16. A method of forming a contact, comprising: depositing a doped semiconductor layer over an exposed surface of a source/drain region of a substrate, wherein the source/drain region is exposed through a trench formed in a dielectric material formed over the source/drain region; depositing a metal silicide layer over the doped semiconductor layer in a first process chamber; transferring the substrate to a second chamber to form an anchor layer over the metal silicide layer and sidewalls of the trench; transferring the substrate to a third chamber to fill the trench with a conductor; and transferring the substrate to a second chamber to heat the substrate such that the conductor reflows within the trench; wherein the source/drain region has a first dopant concentration, and the doped semiconductor layer has a second dopant concentration higher than the first dopant concentration.

17. The method of claim 16, further comprising:
depositing a barrier layer over the metal silicide layer; and
forming an overburden layer over the conductor.

18. The method of claim 17, wherein
the anchor layer and the conductor comprise cobalt (Co), and
the barrier layer comprises nitrogen (N).

19. The method of claim 16, further comprising planarizing the substrate, the planarizing the substrate comprising a chemical mechanical polishing (CMP) process.

* * * * *